United States Patent [19]
Okubo

[11] Patent Number: 4,810,983
[45] Date of Patent: Mar. 7, 1989

[54] CHIP TYPE LC COMPOSITE COMPONENT
[75] Inventor: Akira Okubo, Takefu, Japan
[73] Assignee: Murata Manufacturing Co., Ltd., Kyoto, Japan
[21] Appl. No.: 136,632
[22] Filed: Dec. 22, 1987
[30] Foreign Application Priority Data
Dec. 22, 1986 [JP] Japan ............................ 61-197281[U]
Dec. 22, 1986 [JP] Japan ............................ 61-197282[U]
[51] Int. Cl.$^4$ ........................ H03H 7/00; H01F 15/10
[52] U.S. Cl. .................................. 333/184; 333/185; 336/90; 336/192
[58] Field of Search ............... 333/181, 184, 185, 167; 361/405; 336/192, 198, 208, 90, 96

[56] References Cited
U.S. PATENT DOCUMENTS
3,295,056 12/1966 Matsushima et al. .......... 333/185 X Primary Examiner—Thomas J. Kozma
Attorney, Agent, or Firm—Wenderoth, Lind & Ponack

[57] ABSTRACT

A chip type LC composite component mounted directly on a wiring pattern on a printed substrate and suitable for use as a noise filter, comprising; a dielectric bobbin comprising a coil winding portion and first and second flanges provided at both ends thereof; first and second electrodes provided on one main surface of the first flange and spaced at a predetermined interval; a third electrode provided on the one main surface of the second flange, and a coil wound around the coil winding portion and connecting at one of a pair of lead terminals of said coil with the first electrode and at the other with the third electrode, so that said coil forms an inductor between the first and the third electrodes and a capacitor connected to one end of the inductor and provided between the first and the second electrodes spaced at the predetermined intervals, thereby having a superior filter characteristic when used as a noise filter.

2 Claims, 4 Drawing Sheets

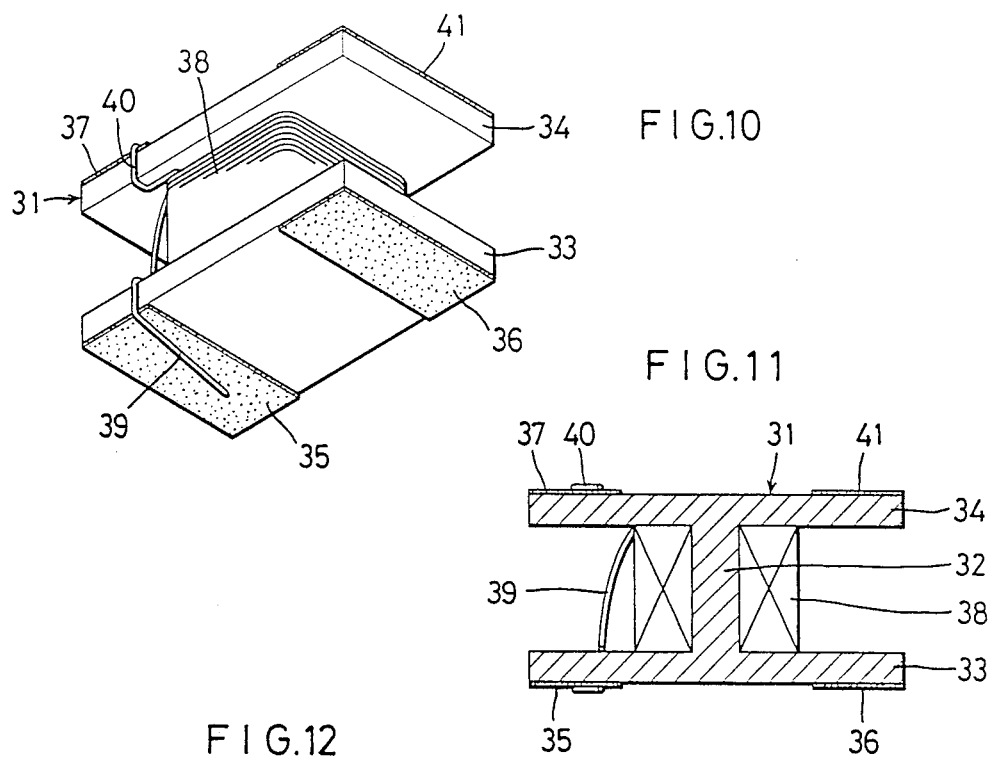
FIG.10
FIG.11
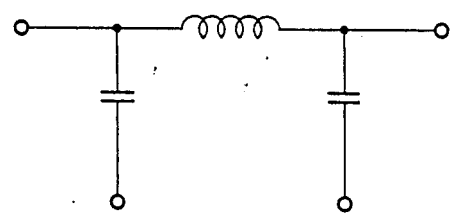
FIG.12
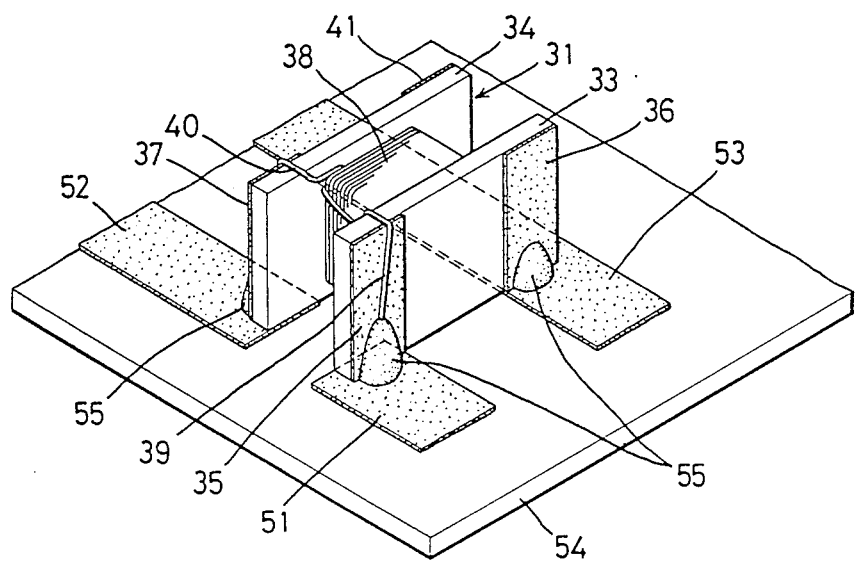
FIG.13

CHIP TYPE LC COMPOSITE COMPONENT

FIELD OF THE INVENTION

The present invention relates to a chip type LC composite component suitable for use as, for example, a noise filter, and more particularly to a chip type LC composite component superior in reliability for mounting and in the filter characteristic without the need to enlarge an entire configuration or reduce electrostatic capacitance.

DESCRIPTION OF THE PRIOR ART

Referring to FIG. 14, the conventional LC composite component used at the noise filter is shown, in which the LC composite componnet is so constructed that a cylindrical dielectric 1 is provided at the inner periphery thereof with electrodes 2 and 3 (to be hereinafter called the internal electrodes 2 and 3) separate from each other and at the outer periphery with an electrode 4 (to be hereinafter called the external electrode 4) opposite in common to the internal electrodes 2 and 3 to thereby form a cylindrical capacitor 5, into which a ferrite bead 7 through which a central conductor 6 perforates is inserted, both opening ends of the cylindrical capacitor 5 are filled with solder 8 so as to connect the internal electrodes 2 and 3 with the central conductor 6 respectively, and eyelet member 9 at need is fitted onto the external electrode 4 and connected thereto with soldering 10.

Such conventional LC composite component, however, combines the capacitor 5 and ferrite bead 7 separate therefrom, thereby creating the problem in that the product is large-sized and complicated to produce.

Referring to FIG. 15, a chip type LC composite component (in U.S. patent application Ser. No. 066,622) is shown which has recently been proposed in order to solve the aforesaid problem. The chip type LC composite component in FIG. 15 is so constructed that a dielectric bobbin 14 comprises a coil winding trunk 11 and first and second flanges 12 and 13 at both ends thereof, a coil 15 is wound onto the coil winding trunk 11, a pair of lead terminals 16 and 17 of the coil 15 are connected to first and second electrodes 18 and 19 formed on the first flange 12 respectively, and a third electrode 20 is formed between the first and the second electrodes 18 and 19.

Such chip type LC composite component shown in FIG. 15 forms a so-called π-type equivalent circuit as shown in FIG. 16, and, for example, as shown in FIG. 17, fixedly connects the first through third electrodes 18, 19 and 20 by soldering 25 to a pair of input and output patterns 21 and 22 and an earth pattern 23 which are formed on one side surface of a printed substrate 24 thus being mounted thereon.

The chip type LC composite component, which juxtaposes the first through third electrodes 18, 19 and 20 on the bottom surface of the first flange 12, is extremely restricted in an interval between the electrodes 18 and 20 and that between those 19 and 20. Therefore, the intervals between the patterns 21, 22 and 23 on the printed substrate 24 are extremely restricted, thereby having a fear that solder bridges are apt to be created when the electrodes 18, 19 and 20 are soldered to the patterns 21, 22 and 23 respectively to thereby lower the reliability for mounting the LC composite component on the substrate 24. Also, an interval between the first and second electrodes 18 and 19 is narrow so as to increase the distributed capacity formed therebetween and lower the self-resonance frequency of the coil 15. As a result, the chip type LC composite component, when used as the noise filter, has inconvenience of causing deterioration in the filter characteristic.

When the respective electrodes are intended to be enlarged of interval therebetween in order to eliminate the above defect, inconvenience will be caused in that the entire configuration may be larger or the electrostatic capacitance of each capacitor formed between the electrode 18 and 20 and between those 20 and 19 is reduced.

OBJECT OF THE INVENTION

As object of the invention is to provide a chip type LC composite component which improves mounting reliability without the need to enlarge the entire configuration of the composite component or to reduce the electrostatic capacitance of the capacitor, thereby having a superior filter characteristic when used as the noise filter.

The above and other objects and features of the invention will appear more fully hereinafter from a consideration of the following description taken in connection with the accompanying drawings wherein one example is illustrated by way of example.

BRIEF DESCRIPTION OF THE DRAWINGS

FIG. 10 is a perspective view thereof, when viewed from the reverse side, FIG. 11 is a longitudinally sectional view of the same, FIG. 12 is an equivalent circuit diagram of the same, FIG. 13 is a perspective view exemplary of a mounting condition of the same.

DESCRIPTION OF THE PREFERRED EMBODIMENTS

Figure 1:
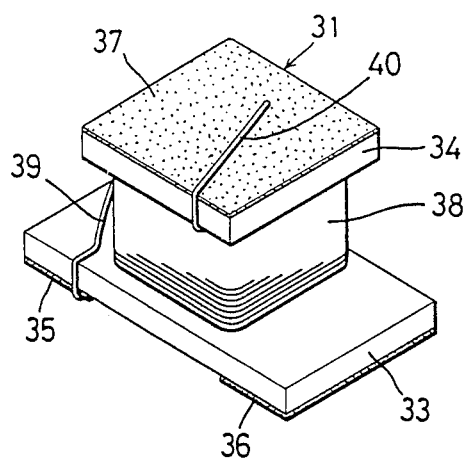
FIG. 1 is a perspective view of a first embodiment of a chip type LC composite component of the invention.
Figure 2:
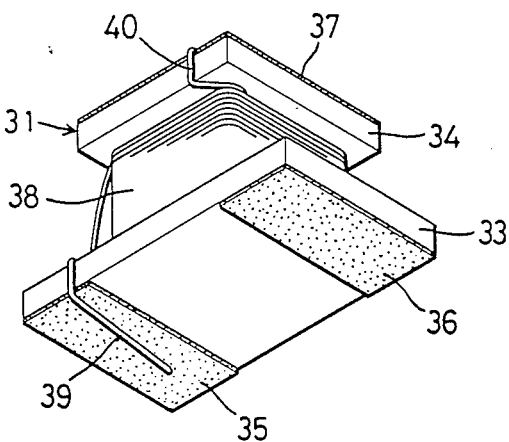
FIG. 2 is a perspective view of the same, when viewed from the reverse side.
Figure 3:
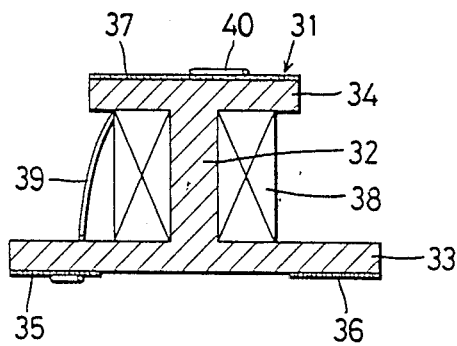
FIG. 3 is a longitudinally sectional view of the same.

A first embodiment of a chip type composite component of the invention is shown in FIGS. 1 through 3, in which a reference numeral 31 designates a bobbin which comprises a coil winding trunk 32 of a prism-like shape and first and second flanges 33 and 34 formed at both ends thereof and is formed of dielectric material, such as barium titanate or titanium oxide, 35 and 36 designate first and second electrodes provided at both lengthwise ends of the bottom surface of one main surface of the first flange 33 and spaced at a predetermined interval, 37 designates a third electrode provided at one main surface of the second flange 34, and 38 designates a coil wound around the coil winding trunk 32 and connected at a pair of lead terminals 39 and 40 to the first and third electrodes 35 and 37 by means of soldering (not shown) or the like.

Figure 4:
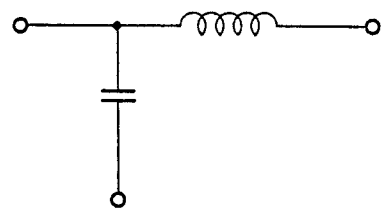
FIG. 4 is an equivalent circuit diagram of the same.

The first embodiment of the chip type LC composite component of the invention constructed as above-mentioned forms the so-called L-type equivalent circuit as shown in FIG. 4. In detail, the coil 38 forms an inductor between the first and the third electrodes 35 and 37 and a capacitor formed between the first and the second electrodes 35 and 36 and connected to one end of the inductor.

The first embodiment of the chip type LC composite component of the invention thus forms the L-type equivalent circuit, so that when the same is used as a noise filter to eliminate high frequency noise, the capacitor does not function as a by-pass capacitor for the inductor, thereby enabling the noise to be properly eliminated. Also, since the first and third electrodes 35 and 37 are apart from each other, the coil 38 connected therebetween decreases in distributed capacity to raise the self-resonance frequency of coil 38, whereby the chip type LC composite component of the invention, when used as the noise filter, demonstrates a superior filter characteristic.

Figure 5:
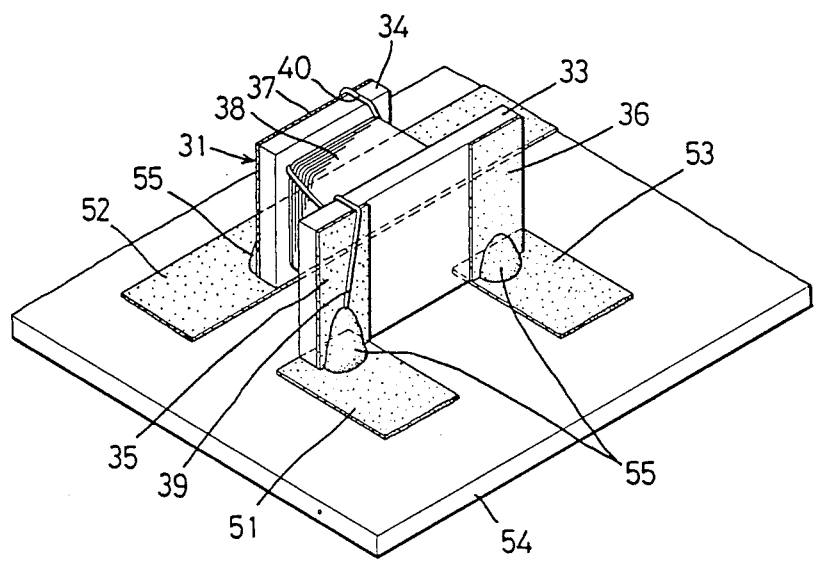
FIG. 5 is a perspective view exemplary of a mounting condition of the same.

The chip type LC composite component, for example, as shown in FIG. 5, is used in such a manner that a printed substrate 54 is provided at the upper surface thereof with a pair of input and output patterns 51 and 52 and en earth pattern 53, and the first and third electrodes 35 and 37 and input and output patterns 51 and 52, and the second electrode 36 and earth pattern 53, are fixedly connected by soldering 55 or the like respectively, whereby the LC composite component is mounted on the printed substrate 54.

Figure 17:
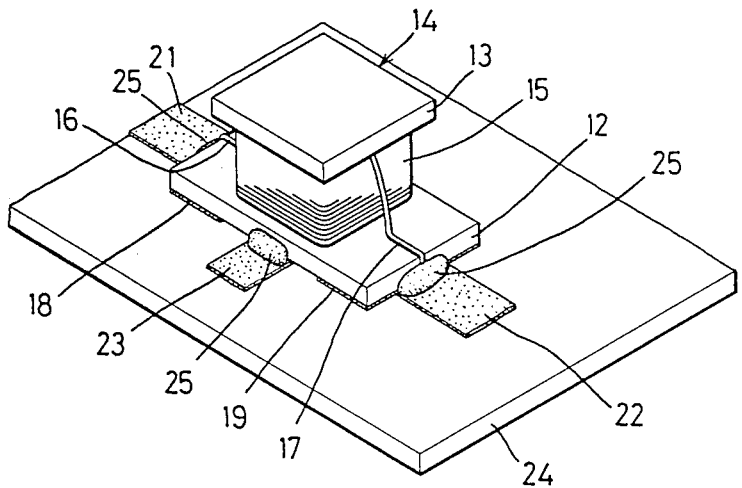
FIG. 17 is a perspective view exemplary of a mounting condition of the same.

In this case, a printed substrate 24 used for mounting thereon the previously proposed chip type LC composite component shown in FIG. 17, must be provided thereon and between a pair of input patterns 21 and 22 with an earth pattern 23, whereby intervals between the patterns 21 and 23, and 22 and 23 are restricted so as to complicate the design. On the contrary, the printed substrate 54 used for mounting thereon the first embodiment of the chip type LC composite component of the invention shown in FIG. 5 need not be provided thereon and between the pair of input and output patterns 51 and 52 with the earth pattern 53, whereby the intervals between the respective patterns 51, 52 and 53 are larger so as to facilitate the design and also, when soldered 55, the solder bridge is hard to occur, thereby reliably mounting the chip type LC composite component to the substrate 54.

Next, explanation will be given on a second embodiment of the chip type LC composite component of the invention with reference to FIGS. 6 through 7.

Figure 6:
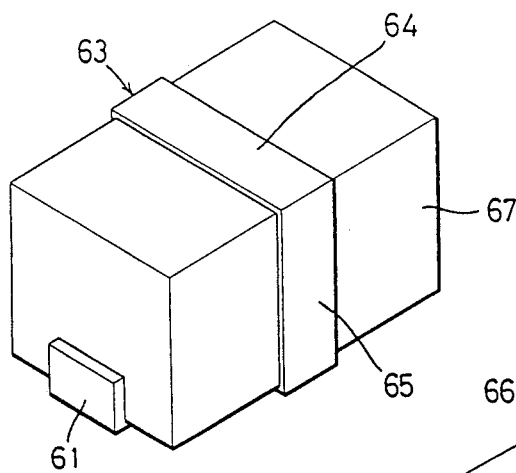
FIG. 6 is a perspective view of a second embodiment of the chip type LC composite component of the invention.
Figure 7:
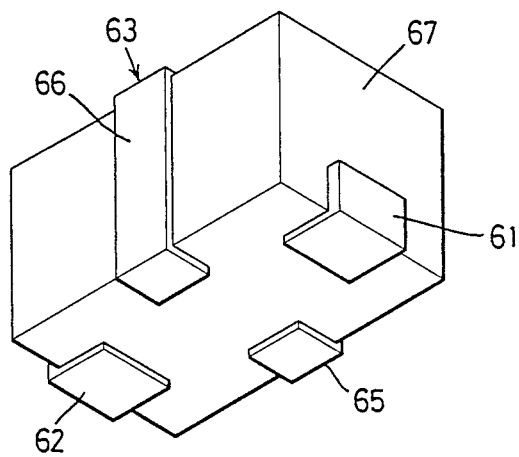
FIG. 7 is a perspective view thereof, when viewed from the reverse side.
Figure 8:
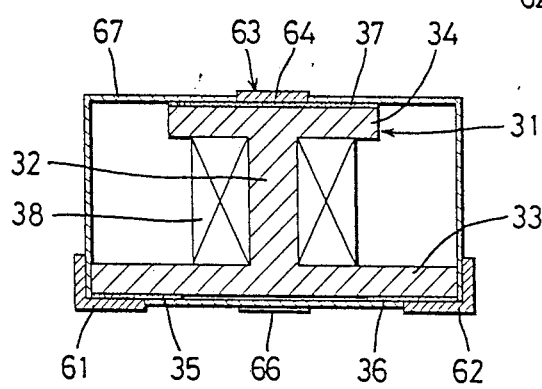
FIG. 8 is a longitudinally sectional view of the same.

In addition, the basic construction in FIGS. 6 through 8 is the same as that in FIGS. 1 through 3, so that the members in the second embodiment as the same as those in the first embodiment will be designated by the same reference numerals and omitted of description.

In FIGS. 6 through 8, reference numerals 61 and 62 designate frame terminals which are substantially L-like-shaped and connected at one ends to the first and second electrodes 35 and 36 and which extend at the other ends upwardly along the both end surfaces of the first flange 33 respectively, 63 designates a substantially U-like-shaped frame terminal, which is connected at its head 64 to the third electrode 37 and extends at both legs 65 and 66 along the coil winding trunk 32 and bends toward the bottom surface of the first flange 33 in an embracing manner, and 67 designates insulating resin for covering the outer periphery of the bobbin 31 excepting for the exposed frame terminals 61, 62 and 63. The insulating resin 67 is formed by being potted into an insulating resin case or by being subjected to mold-resin processing.

The second embodiment of the chip type LC composite component constructed as above-mentioned is higher in reliability than the first embodiment shown in FIGS. 1 through 3.

Figure 9:
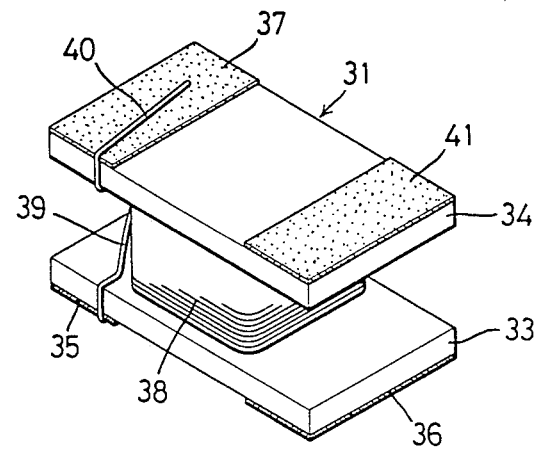
FIG. 9 is a perspectively view of a third embodiment of the chip type LC composite component of the invention.
Figure 14:
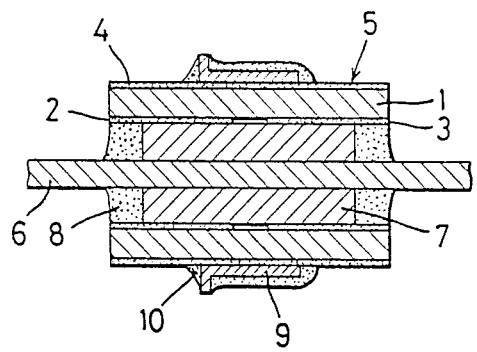
FIG. 14 is a sectional view exemplary of the conventional LC composite component.
Figure 15:
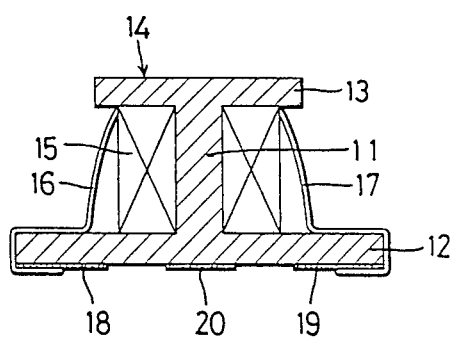
FIG. 15 is a sectional view of the previously proposed chip type LC composite component.
Figure 16:
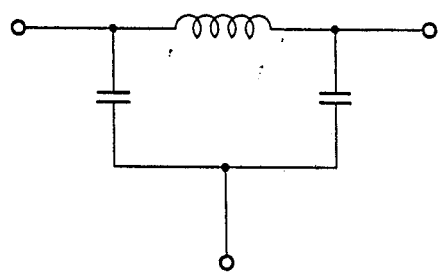
FIG. 16 is an equivalent circuit diagram thereof.

Next, explanation will be given on a third embodiment of the chip type LC composite component shown in FIGS. 9 through 11.

In addition, the third embodiment is the same in basic construction as the first embodiment in FIGS. 1 through 3 so that the same members as those in the first embodiment are designated by the same reference numerals and omitted of description.

The third embodiment of the chip type LC composite component is so constructed that an electrode to be provided onto a second flange 34 at a bobbin 31 is divided into a third electrode 37 and a fourth electrode 41 which are provided at both lengthwise end portions on one main surface of the second flange 34 and spaced at a predetermined interval, and a pair of lead terminals 39 and 40 of a coil 38 wound around a coil winding trunk 32 are connected to a first electrode 35 and the third electrode 37 by soldering or the like respectively.

The third embodiment of the chip type LC composite component of the invention constructed as above-mentioned forms a $\pi$-type equivalent circuit as shown in FIG. 12.

In other words, the coil 38 forms an inductor between the first and third electrodes 35 and 37, and capacitors are formed between the first and the second electrodes 35 and 36 and between the third and the fourth electrodes 37 and 41 and connected to both ends of the inductor respectively.

The chip type LC composite component, for example, as shown in FIG. 13, is used in such a manner that a printed substrate 54 is provided at the one surfafe with a pair of input and output patterns 51 and 52 and an earth pattern 53 so that the first and third electrodes 35 and 37 are fixedly connected with the input and output patterns 51 and 52, and the second and fourth electrodes 36 and 41 with the earth pattern 53 by use of soldering or the like respectively, thus mounting the component on the substrate 54.

Especially, the chip type LC composite component shown in the third embodiment has the second and fourth electrodes 36 and 41 both connected to the earth pattern 53, so that, when used as the noise filter, the capacitor does not function as the by-pass capacitor for the inductor, thereby enabling noises to be properly eliminated.

In addition, the chip type LC composite component of the invention is not limited to the aforesaid embodiments and of course moderately changeable in a range of not chaning the principle of the invention.

For example, the respective electrodes 35, 36, 37 and 41 may at need be formed across the side surface and end surfaces of each flange 33 or 34.

Alternatively, the first and second flanges 33 qnd 34 may form at the lateral surfaces thereof recesses through which the lead terminals 39 and 40 of the coil 38 may be connected to the first and third electrodes 35 and 37 formed at one main surfaces of the flanges 33 and 34 respectively.

In addition, the chip type LC composite component of the invention is not defined to the noise filter.

Although several embodiments have been described, they are merely exemplary of the invention and not to be constructed as limiting, the invention being defined solely by the appended claims.

I claim:

1. A chip type LC composite component characterized by comprising,
   a bobbin which comprises a coil winding portion and first and second flanges provided at both ends of said coil winding portion, and is formed of a dielectric material,
   first and second electrodes formed on one main surface of said first flange and spaced from each other at a predetermined interval,
   an electrode formed on one main surface of said second flange, and
   a coil wound around said coil winding portion and connected at one of a pair of lead terminals of said coil to said first electrode at said first flange and at the other of the same to said electrode at said second flange.

2. A chip type LC composite component as set forth in claim 1, wherein said electrode formed at the one main surface of said second flange comprises third and fourth electrodes spaced at a predetermined space and the other of said lead terminals of said coil is connected to said third electrode.

* * * * *